United States Patent [19]
Fister

[11] Patent Number: 6,104,669
[45] Date of Patent: Aug. 15, 2000

[54] METHOD AND APPARATUS FOR GENERATING MEMORY ADDRESSES FOR TESTING MEMORY DEVICES

[75] Inventor: Wallace E. Fister, Meridian, Id.

[73] Assignee: Micron Technology, Inc., Boise, Id.

[21] Appl. No.: 09/338,257

[22] Filed: Jun. 22, 1999

Related U.S. Application Data

[62] Division of application No. 09/083,830, May 22, 1998.

[51] Int. Cl.$^7$ .................................................. G11C 8/00
[52] U.S. Cl. ...................................... 365/236; 365/230.01
[58] Field of Search .................................. 365/236, 201, 365/200, 230.01, 230.06; 371/21.1

[56] References Cited

U.S. PATENT DOCUMENTS

| | | | |
|---|---|---|---|
| 4,827,476 | 5/1989 | Garcia | 371/25 |
| 5,262,998 | 11/1993 | Mnich et al. | 365/222 |
| 5,349,562 | 9/1994 | Tanizaki | 365/222 |
| 5,390,149 | 2/1995 | Vogley et al. | 365/189.01 |
| 5,410,687 | 4/1995 | Fujisaki et al. | 395/575 |
| 5,418,920 | 5/1995 | Kuddes | 395/425 |
| 5,477,491 | 12/1995 | Shirai | 365/194 |
| 5,550,784 | 8/1996 | Takai | 365/233 |
| 5,560,000 | 9/1996 | Vogley | 395/550 |
| 5,572,722 | 11/1996 | Vogley | 395/555 |
| 5,583,823 | 12/1996 | Park | 365/230.03 |
| 5,610,874 | 3/1997 | Park et al. | 365/236 |
| 5,615,358 | 3/1997 | Vogley | 395/556 |
| 5,715,206 | 2/1998 | Lee et al. | 365/222 |
| 5,808,958 | 9/1998 | Vogley et al. | 365/233 |
| 5,818,772 | 10/1998 | Kuge | 365/201 |
| 5,926,828 | 7/1999 | Khandekar | 711/111 |

*Primary Examiner*—Richard Elms
*Assistant Examiner*—Anh Phung
*Attorney, Agent, or Firm*—Dorsey & Whitney LLP

[57] ABSTRACT

A counter internal to a memory device for generating memory addresses in physical or logical sequence in non-redundant or redundant memory space, counting up or down in increments of the user's choice. The counter may be advantageously used to generate memory addresses for functional testing of the memory cells within the memory device.

8 Claims, 2 Drawing Sheets

METHOD AND APPARATUS FOR GENERATING MEMORY ADDRESSES FOR TESTING MEMORY DEVICES

CROSS-REFERENCE TO RELATED APPLICATION

This application is a divisional of pending U.S. Pat. application Ser. No. 09/083,830, filed May 22, 1998.

TECHNICAL FIELD

This invention relates generally to memory devices and more particularly, to a method and apparatus for generating addresses for testing memory devices.

BACKGROUND OF THE INVENTION

Conventional memory devices have relied upon external test circuitry to generate row and column addresses for testing the functionality of individual memory cells in memory devices. This, however, requires complicated programming of the test equipment as well as the inclusion of circuitry in the tester to generate memory addresses. The test equipment must be programmed with each memory address to be tested for a given memory device. Each time a new memory device is to be tested a new set of memory addresses must be programmed into the test equipment. The additional circuitry required to generate memory addresses within the tester also contributes to increased costs, both initial and maintenance, of the test equipment. The test capabilities of the tester are also limited because conventional drive circuitry is limited by the number of devices it can test in parallel. For example, when testing 16 memory devices, each having 20 address pins, the test equipment must drive 320 pins. This can require significant resources in the tester's drive circuitry.

In addition, conventional test equipment and conventional memory devices have further limitations. For example, some conventional test equipment was designed to use 16 address pins. As technology progressed, some memory devices began using additional address bits, requiring additional address pins, for example, 20 pins. If a conventional memory device having 20 address pins were to be tested using conventional test equipment designed to use only 16 address pins, additional test equipment would be needed to control the 4 pins not addressed by the conventional test equipment.

On-chip counters that generate memory addresses are in use in some DRAMs as part of a refresh circuitry. During normal operation of the DRAM, a data bit contained within a memory cell must be periodically refreshed. This is because the data bit is stored in a capacitor that has a slight leakage current. The refresh operation restores the data to its full logic 1 or logic 0 level. As part of this operation a refresh counter cycles through the row addresses, with additional circuitry refreshing each row address in turn as its address is specified by the refresh counter.

A refresh counter, however, is limited to generating non-redundant addresses in logical order. They do not generate redundant row addresses, and do not generate row addresses in an order that corresponds to the physical layout of the memory cells (i.e., physical order).

It is extremely important that during testing, addresses can be generated in physical order. Due to design constraints, it is not unusual for the memory array to have adjacent memory cells that have non-sequential memory addresses. For example, a memory cell having the address of row two, column six might be physically adjacent to a memory cell having the address of row three, column six. As a result of being physically adjacent, the memory addresses of row two, column six and row three, column six would then be in physical sequence/order.

Further, one of the tests of functionality checks for charge leakage between adjacent memory cells. In the example above, the test would check to see if a charge applied to the memory cell having the address of row two, column six, would appear on the adjacent memory cell having the address of row three, column six, or vice versa. This could result if a short occurred between the memory cells, indicating a defect in the memory device.

This test is put into practice by writing to one row/column, and then reading an adjacent row/column. In order to implement this, a counter must be able to generate memory addresses in physical order for the writing and then reading of the memory cells. When testing for functionality, it does no good to write to, for example, row one, column one and read from row two, column one (two memory cells in logical sequence/order), to check for leakage if the two memory cells are not adjacent (i.e., in physical sequence/order), as they rarely are. This is because the charge leakage, if any, usually only occurs between adjacent cells. Because refresh counters generate row addresses in a logical order, and do not generate row addresses in physical order, refresh counters are unsuited for this type of test.

As mentioned above, refresh counters are unable to generate memory addresses for redundant rows. Most memory chips today contain extra rows and columns of memory cells. When a defect is detected in a row/column of memory cells, additional circuitry deactivates the defective row/column and activates one of the redundant rows/columns. For example, a memory chip may contain four thousand and one hundred rows of memory cells. Of the four thousand and one hundred rows, rows zero through four thousand and ninety five, for example, are considered "non-redundant" memory space, and are used during normal operation. Rows four thousand and ninety six to four thousand and ninety nine would then be considered "redundant" rows, and would only be used if a defect is found in one of the "non-redundant" rows. This same architecture also applies to columns.

If a defect were detected in row twelve, for example, row four thousand and ninety six would be used in its place. Significantly, the memory address of "row twelve" would not become void. Instead, the memory address of "row twelve" would be reassigned by the additional circuitry to row four thousand and ninety six. Thus, data would continue to be written to and read from the memory address of "row twelve", but this data would be physically located in row four thousand and ninety six.

In keeping with this architecture, refresh counters are only needed to generate memory addresses within the "non-redundant" memory space. The refresh counter never needs to generate a memory address of a "redundant" row because either the redundant row does not contain data, and therefore no memory address needs to be generated because no data needs to be refreshed, or the redundant row does contain data needing periodic refreshing, but has been assigned a memory address from the "non-redundant" memory space, and generation of a "non-redundant" memory address by the refresh counter refreshes the redundant row.

Because refresh counters are not capable of generating memory addresses for the "redundant" rows, refresh counters are not suitable to test the functionality of memory cells within a memory device.

SUMMARY OF THE INVENTION

The present invention provides apparatus and methods for generating memory addresses within an integrated memory device. A memory device includes a memory addressing circuit integrated within the memory device for generating memory addresses during testing for functionality. The memory addressing circuit uses a counter or counters to generate the memory addresses. The memory addressing circuit may generate a single memory address or a series of memory addresses in logical or physical sequences, including redundant elements of the memory array. The memory addressing circuit may generate either a row address, a column address, or both addresses.

DETAILED DESCRIPTION OF THE INVENTION

Figure 1:
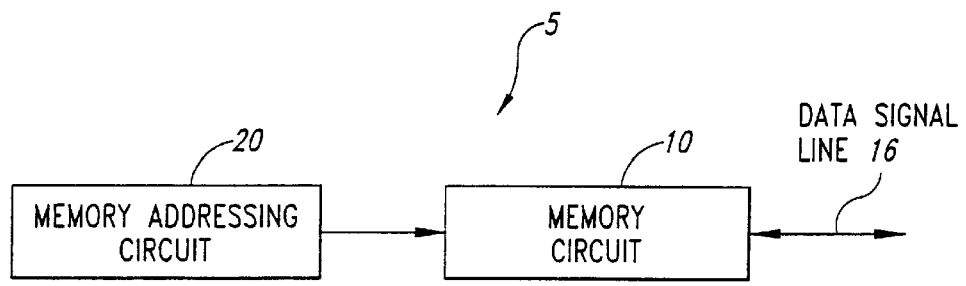
FIG. 1 is a functional block diagram of a memory device in accordance with one embodiment of the present invention.

FIG. 1 is a functional block diagram of an embodiment of an integrated memory device 5 in accordance with the invention. The memory device 5 includes a memory circuit 10, a memory addressing circuit 20, and a data signal line 16. The memory circuit 10 may include a plurality of memory cells, each cell corresponding to a memory address.

The memory addressing circuit 20 is coupled to the memory circuit and generates a memory address during functional testing to select a memory cell corresponding to the memory address. Data can then be either read from the selected memory cell and transmitted onto the data signal line 16, or received from the data signal line 16 and written to the selected memory cell.

The memory addressing circuit 20 can generate memory addresses in a logical sequence, e.g, 0, 1, 2 or in a physical sequence, i.e., memory cells that are physically adjacent to each other. The memory addressing circuit 20 can also generate memory addresses in ascending or descending order, and can generate consecutive addresses, e.g., 0, 1, 2, or non-consecutive addresses, e.g., 0, 2, 4, or 0, 4, 2, in increments of the user's choice. This allows the user to run various tests to determine the functionality of the memory device 10. For example, the memory addressing circuit 20 can write a logic 1 to memory cells in alternating rows or columns or in a checkerboard pattern. A subsequent read of the cells that did not receive the logic 1 allows the user to determine if any leakage between the cells occurred. This too can be implemented with the memory addressing circuit 20, with the memory addressing circuit 20 generating memory addresses for all of the cells that did not receive the logic 1 so that they may be read to determine if a logic 1 from an adjacent memory cell has leaked across. The memory addressing circuit 20 can also generate memory addresses within the "redundant" memory space, thereby allowing for complete testing of all memory cells within the memory device 5.

Due to the memory addressing circuit 20 being internal to the memory device 5, there is no need to generate and provide the memory addresses externally. This decreases the complexity of the external testing circuitry and allows for a reduction of power used by the test equipment due to a reduction in circuitry.

The test equipment also need not be programmed with the identity of the memory cells to be checked. Instead, this information resides within the memory addressing circuit 20, and only needs to be activated by an appropriate signal. In one embodiment, the memory addressing circuit would generally obviate the need for additional test equipment when a discrepancy exists between the number of address pins the test equipment was designed to use versus the number of address pins on the memory device. The test equipment would only need to send an "initiate test" signal, for example, and the addressing circuit 20 would control the selection of memory addresses using the appropriate number of address bits. This would allow test equipment designed to drive 16 address pins, for example, to test a memory device using 20 address pins, for example, without additional test equipment or modification of the existing test equipment.

Figure 2:
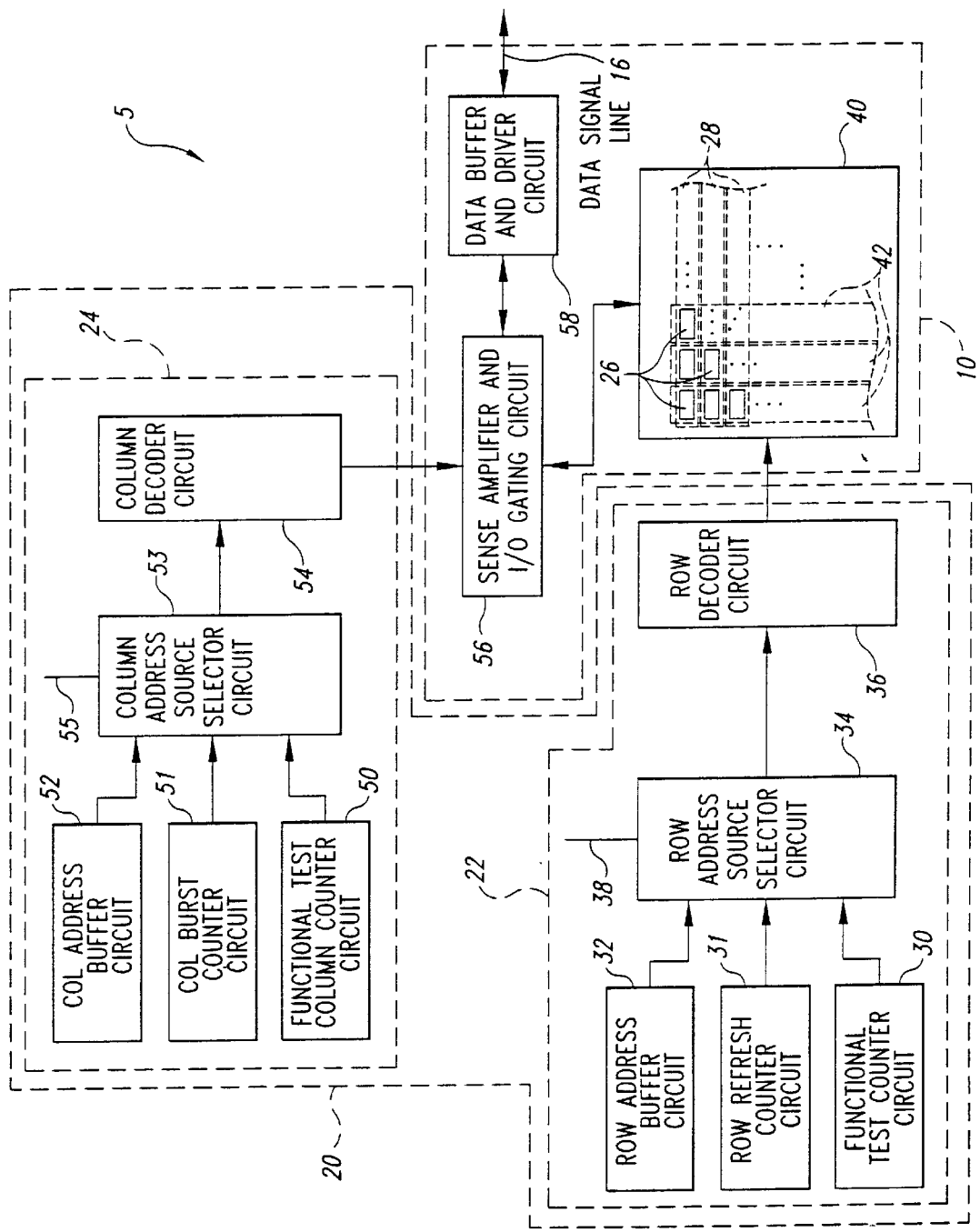
FIG. 2 is a functional block diagram of a memory device in accordance with another embodiment of the present invention.

FIG. 2 is a functional block diagram of embodiments of the integrated memory device 5 of FIG. 1 showing the memory circuit 10 and the addressing circuit 20 in greater detail. The memory addressing circuit 20 includes a row counter 22 and a column counter 24. The memory circuit 10 includes a plurality of memory cells 26, each corresponding to a row address and a column address.

The row counter 22 generates a row address to select a corresponding row 28 of memory cells 26 in the memory circuit 10. In one embodiment, the row counter 22 includes a functional test row counter circuit 30, a row refresh counter 31, a row address buffer circuit 32, a row address source selector circuit 34, and a row decoder circuit 36. During functional testing the functional test row counter circuit 30 generates a row address signal and applies this signal to the row address source selector circuit 34. The row address signal contains a binary coded row address that corresponds to a row 28 of memory cells 26 in the memory circuit 10.

The row address source selector circuit 34 receives a control signal on a first control line 38 that causes the row address source selector circuit 34 to couple the row decoder circuit 36 to one of various sources of row address signals, such as the functional test row counter circuit 30, the row refresh counter circuit 31, or the row address buffer circuit 32.

In response to the control signal, the row address source selector circuit 34 couples the row address buffer circuit 32 to the row decoder circuit 36 during normal read and write operations, and to the row refresh counter circuit 31 during refresh operations. Both of these operations are known to those skilled in the art and will not be discussed further in the interest of brevity. During functional testing the row address source selector circuit 34 couples the row decoder circuit 36 to the functional test row counter circuit 30 in response to the control signal. This coupling causes the row address signal to be applied to the row decoder circuit 36.

In response to receiving the row address signal, the row decoder circuit 36 decodes the row address and, as is understood by those skilled in the art, selects a row 28 of memory cells 26 in a memory array 40 that corresponds to the row address generated by the functional test row counter circuit 30. The row address source selector circuit 34 and the row decoder circuit 36 can be any of a variety of suitable circuits that are well known in the art. Those skilled in the art will recognize that the functions of the row counter 22, or portions thereof, could also be included in the memory circuit 10.

The column counter 24 generates a column address to select a corresponding column 42 of memory cells 26 in the memory circuit 10. In one embodiment, the column counter 24 includes a functional test column counter circuit 50, a column burst counter 51, a column address buffer circuit 52, a column address source selector circuit 53, and a column decoder circuit 54. During functional testing the functional test column counter circuit 50 generates a column address signal and applies it to the column address source selector circuit 53. The column address signal contains a coded column address that corresponds to a column 15 of memory cells 26 in the memory circuit 10.

The column address source selector circuit 53 receives a control signal on a second control line 55 that causes the column address source selector circuit 53 to couple the column decoder circuit 54 to one of various sources of column address signals, such as the functional test column counter circuit 50, the column burst counter circuit 51, or the column address buffer circuit 52.

In response to the control signal, the column address source selector circuit 53 couples the column address buffer circuit 52 to the column decoder circuit 54 during normal read and write operations, and to the column burst counter circuit 51 during burst operations. Both of these operations are known to those skilled in the art and will not be discussed further in the interest of brevity. During functional testing the column address source selector circuit 53 couples the column decoder circuit 54 to the functional test column counter circuit 50 in response to the control signal. This coupling causes the column address signal to be applied to the column decoder circuit 54. In response to receiving the column address signal, the column decoder circuit 54 decodes the column address and generates a column select signal, applying it to a sense amplifier and I/O gating circuit 56, which is part of the memory circuit 10. The sense amplifier and I/O gating circuit 56 then couples a memory cell 26 in the memory array 40 to a data buffer and driver circuit 58. The memory cell 26 coupled to the data buffer and driver circuit 58 has a column address corresponding to the column address generated by the functional test column counter circuit 50 and a row address corresponding to the row address generated by the functional test row counter circuit 30. The column address source selector circuit 53 and the column decoder circuit 54 can be any of a variety of suitable circuits that are well known in the art. Those skilled in the art will recognize that the functions of the column counter 24, or portions thereof, could also be included in the memory circuit 10.

Again, the row and column counters 22, 24, and in one embodiment, the row and column counter circuits 30, 50 can generate memory addresses in a logical sequence, e.g., 0, 1, 2, or in a physical sequence, i.e., memory cells 26 that are physically adjacent to each other. The row and column counters 22, 24 can also generate memory addresses in ascending or descending order, and can generate consecutive addresses, e.g., 0, 1, 2, or non-consecutive addresses, e.g., 0, 2, 4, or 0, 4, 2, in increments of the user's choice. This allows the user to run various tests to determine the functionality of the memory device 5. For example, the row and column counter circuits 22, 24 can write a logic 1 to alternating rows/columns 28, 42, or in a checkerboard pattern. The row and column counters 22, 24 can also generate memory addresses within the "redundant" memory space, thereby allowing for complete testing of all memory cells 26 within the memory device 5. The manner of programing counters to output various sequences of addresses is known to those skilled in the art.

A subsequent read of the cells 26 that did not receive the logic 1 allows the user to determine if any leakage between the cells occurred. This too can be implemented with the row and column counters 22, 24, generating memory addresses for all of the cells 26 that did not receive the logic 1 so that they may be read to determine if a logic 1 from an adjacent memory cell 26 has leaked across.

The combination of the row address generated by the row counter 22 and the column address generated by the column counter 24 select a specific memory cell 26 within the memory array 40. In a read mode, the sense amplifier and I/O gating circuit 56 applies the contents of the memory cell 26 selected by the row counter 22 and the column counter 24 to the data buffer and driver circuit 58. In response to receiving the signal from the sense amplifier and I/O gating circuit 56, the data buffer and driver circuit 58 applies the contents of the memory cell 26 to the data signal line 16. The data buffer and driver circuit 58 can be any of a variety of suitable buffer and driver circuits that are well known in the art.

Figure 3:
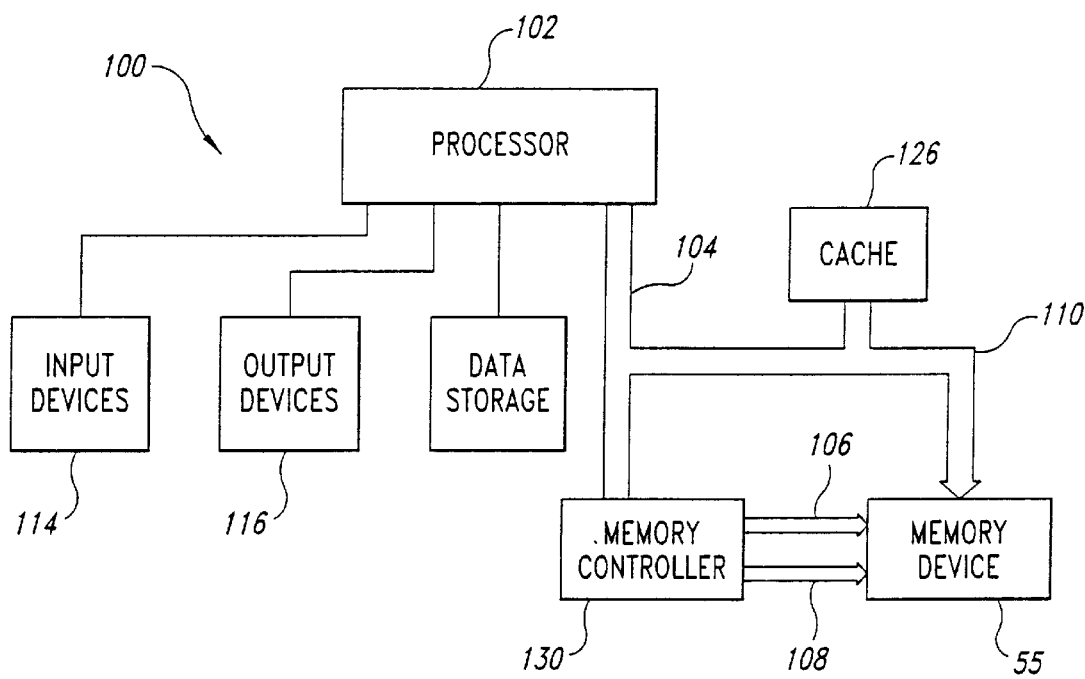
FIG. 3 is a functional block diagram showing the integrated memory device of FIG. 1 used in a conventional computer system.

FIG. 3 is a block diagram of a computer system 100 that includes the memory device 5 of FIG. 2. The computer system 100 includes a processor 102 for performing various computing functions, such as executing specific software to perform specific calculations or tasks. The processor 102 includes a processor bus 104 that normally includes an address bus 106, a control bus 108, and a data bus 110. In addition, the computer system 100 includes one or more input devices 114, such as a keyboard or a mouse, coupled to the processor 102 to allow an operator to interface with the computer system 100. Typically, the computer system 100 also includes one or more output devices 116 coupled to the processor 102, such output devices typically being a printer or a video terminal. One or more data storage devices 118 are also typically coupled to the processor 102 to store data or retrieve data from external storage media (not shown). Examples of typical storage devices 118 include hard and floppy disks, tape cassettes, and compact disk read-only memories (CD-ROMs). The processor 102 is also typically coupled to cache memory 126, which is usually static random access memory ("SRAM") and to the memory device 55 through a memory controller 130. The memory controller 130 normally includes the control bus 108 and the address bus 106 that is coupled to the memory device 55. The data bus 110 may be coupled to the processor bus 104 either directly (as shown), through the memory controller 130, or by some other means.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A computer system, comprising:

a processor having a processor bus;

an input device coupled to the processor and adapted to allow data to be entered into the computer system;

an output device coupled to the processor and adapted to allow data to be output from the computer system; and a memory device coupled to the processor through the processor bus, the memory device comprising:

an array of memory cells arranged in rows and columns;

an addressing circuit coupled to the processor bus and the array of memory cells, the addressing circuit adapted to select one of the plurality of row address sources and one of the plurality of column address sources;

a decoder to receive row and column addresses and activate a corresponding memory cell in the array;

a data path buffer circuit coupled between the array and the processor bus; and a counter coupled to the addressing circuit, the counter adapted to generate memory addresses as row and column addresses from a plurality of row address sources and a plurality of column address sources.

2. The computer system of claim 1 wherein the counter comprises a counter operable to further generate the memory addresses in logical sequence.

3. The computer system of claim 1 wherein the counter comprises a counter operable to further generate the memory addresses in non-redundant memory space.

4. The computer system of claim 1 wherein the counter comprises a counter operable to further generate the memory addresses in redundant memory space.

5. The computer system of claim 1 wherein the counter comprises a counter operable to further generate consecutively a first address and a second address, wherein the first address is higher than the second address.

6. The computer system of claim 1 wherein the counter comprises a counter operable to further generate consecutively a first address and a second address, wherein the first address is lower than the second address.

7. The computer system of claim 1 wherein the counter comprises a counter operable to further generate the memory addresses in consecutive order.

8. The computer system of claim 1 wherein the counter comprises a counter operable to further generate the memory addresses in non-consecutive order.

* * * * *